United States Patent
Sato et al.

(10) Patent No.: US 8,106,840 B2
(45) Date of Patent: Jan. 31, 2012

(54) WINDOW GLASS FOR VEHICLE

(75) Inventors: Ryota Sato, Matsusaka (JP); Shingo Tadokoro, Watarai-gun (JP); Susumu Chonan, Chigasaki (JP); Yukihisa Shimazu, Yokohama (JP)

(73) Assignee: Central Glass Company, Limited, Ube-shi (JP)

( * ) Notice: Subject to any disclaimer, the term of this patent is extended or adjusted under 35 U.S.C. 154(b) by 715 days.

(21) Appl. No.: 11/937,590

(22) Filed: Nov. 9, 2007

(65) Prior Publication Data
US 2008/0111751 A1 May 15, 2008

(30) Foreign Application Priority Data

Nov. 13, 2006 (JP) ................................ 2006-306533

(51) Int. Cl.
*H01Q 1/32* (2006.01)
(52) U.S. Cl. ...................................... 343/711; 343/713
(58) Field of Classification Search .................. 343/704, 343/711, 712, 713
See application file for complete search history.

(56) References Cited

U.S. PATENT DOCUMENTS

| 5,101,212 A | * | 3/1992 | Shinnai et al. | ................ 343/713 |
| 5,654,721 A | * | 8/1997 | Saitou et al. | ................. 343/713 |
| 6,693,597 B2 | * | 2/2004 | Walton et al. | ................. 343/713 |

FOREIGN PATENT DOCUMENTS

| JP | 2002-204112 A | 7/2002 |
| JP | 2004-260504 A | 9/2004 |
| JP | 2004-291821 A | 10/2004 |

* cited by examiner

*Primary Examiner* — Jacob Y Choi
*Assistant Examiner* — Robert Karacsony
(74) *Attorney, Agent, or Firm* — Crowell & Moring LLP

(57) ABSTRACT

A window glass of a vehicle having a roof antenna mounted on an upper rear portion of a roof of the vehicle, has a defogger formed, on the rear window glass, by a plurality of horizontal heating lines which are connected with each other at the respective both ends by busbars; a noise shield pattern provided at a head space of the defogger on the rear window glass and having at least three horizontal lines and at least one vertical line that cross each other; and at least three connecting lines that connect the noise shield pattern and the defogger. The noise shield pattern is formed in a symmetrical shape, and the connecting lines connect the noise shield pattern and the defogger symmetrically at center position and symmetrical positions about the center position in right-and-left direction of the noise shield pattern and the defogger.

6 Claims, 6 Drawing Sheets

WINDOW GLASS FOR VEHICLE

BACKGROUND OF THE INVENTION

The present invention relates to a window glass of a vehicle, which is adapted to prevent noise caused by various kinds of electrical components in the vehicle from being transmitted to a rod-shaped roof antenna (RMA, Roof Mounted Antenna) mounted on an upper rear portion of the roof of the vehicle.

In recent years, a glass antenna which is formed by printing or burning conducting lines of conductive ceramic paste on a surface of a window glass, has been used as a vehicle antenna, and the use of this glass antenna has spread. On the other hand, also a rod-shaped roof antenna mounted on a roof of the vehicle is still used, and often used as diversity reception with the glass antenna.

Nowadays, as electronic technology progresses further, a multitude of electrical components are used in the vehicle. However, some of these electrical components produce noise, and the noise acts on the antenna such as the roof antenna. As a result, there arises a problem that receiving performance of FM radio wave which the roof antenna receives is deteriorated by the noise. And such case has arisen quite often.

For the above problem, the electrical component producing the noise is shielded by conductive material or a conductive body in order to minimize the occurrence of the noise or to reduce the noise to zero. Further, to suppress the occurrence of the noise from the electrical components, measures in which a vehicle body is grounded etc. are taken. However, despite taking these measures, there is a case where the noise cannot be reduced.

For this reason, in order to prevent the noise produced by such electrical components from being transmitted to a side of the antenna, various manners have been proposed.

For instance, one such manner has been disclosed in Japanese Patent Provisional Publication No. 2004-260504 (hereinafter is referred to as "JP2004-260504"). JP2004-260504 has disclosed an antenna structure of the vehicle, which has antenna lines disposed in a head space of an electric heating rear defogger that is provided on a rear window glass of the vehicle. More specifically, in a space between the rear defogger and the antenna lines, a shield line which electromagnetically isolates the rear defogger that is a noise radiation source, is provided.

SUMMARY OF THE INVENTION

With regard to the invention disclosed in the JP2004-260504, in order to prevent the noise produced from the defogger provided on the rear window glass of the vehicle from being transmitted to the antenna lines disposed in the head space, that is, for the sake of shielding this noise, the shield line is inserted between the rear defogger and the antenna lines. With this shield, it becomes possible to prevent the transmission of the noise produced by the defogger to the antenna. However, the various kinds of electrical components are used everywhere in the vehicle, and the noise is produced from these electrical components by the respective operations or actions. Because of this, there arises a problem that the transmission of this noise to the side of the antenna can not be suppressed.

It is therefore an object of the present invention to provide a widow glass of the vehicle, which does not transmit the noise caused by the various kinds of electrical components in the vehicle to the rod-shaped roof antenna mounted on the upper rear portion of the roof of the vehicle, and which does not adversely affect receive sensitivity of the roof antenna.

According to one aspect of the present invention, a window glass of a vehicle having a roof antenna mounted on an upper rear portion of a roof of the vehicle, comprises: a defogger formed by a plurality of horizontal heating lines on the rear window glass, the horizontal heating lines being connected with each other at the respective both ends by busbars; a noise shield pattern provided at a head space of the defogger on the rear window glass, the noise shield pattern having at least three horizontal lines and at least one vertical line that cross each other, and forming a symmetrical pattern; and at least three connecting lines connecting the noise shield pattern and the defogger at each center position in right-and-left direction of the noise shield pattern and the defogger and symmetrical positions about the center position in right-and-left direction of the noise shield pattern and the defogger.

The other objects and features of this invention will become understood from the following description with reference to the accompanying drawings.

DETAILED DESCRIPTION OF THE INVENTION

Figure 1:
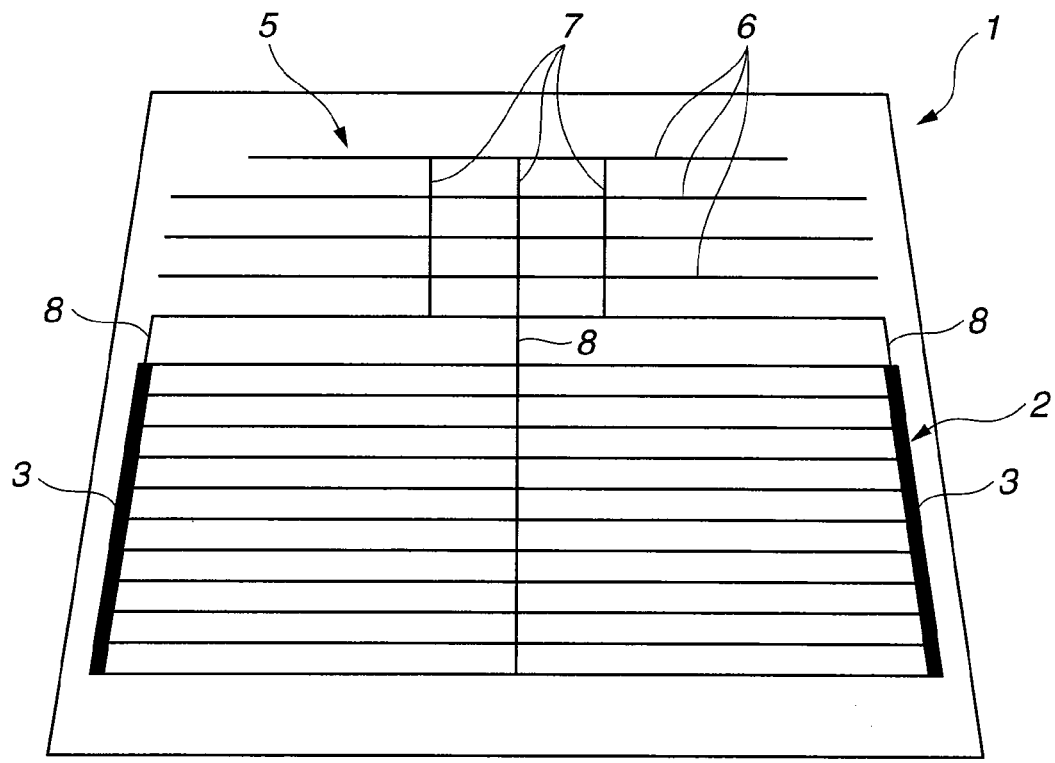
FIG. 1 is a front view of a rear window glass, showing a first embodiment of the present invention.

The present invention is a window glass of a vehicle, which has a noise shield pattern provided at a head space of a defogger that is disposed on a surface of the rear window of the vehicle. With this noise pattern, noise produced from electrical components in the vehicle by the respective operations or actions, is shielded so that the noise is not transmitted to a rod-shaped roof antenna (RMA, Roof Mounted Antenna) mounted on an upper rear portion of the roof shown in FIG. 8.

The defogger is the one that defogs the rear window by electric heating. As can be seen in the drawings, the defogger is formed such that a plurality of horizontal heating lines are connected with each other at the respective both ends by busbars. DC supply (not shown) is connected between both busbars, the defogger is then heated up, and removes fogging of the rear window.

Figure 2:
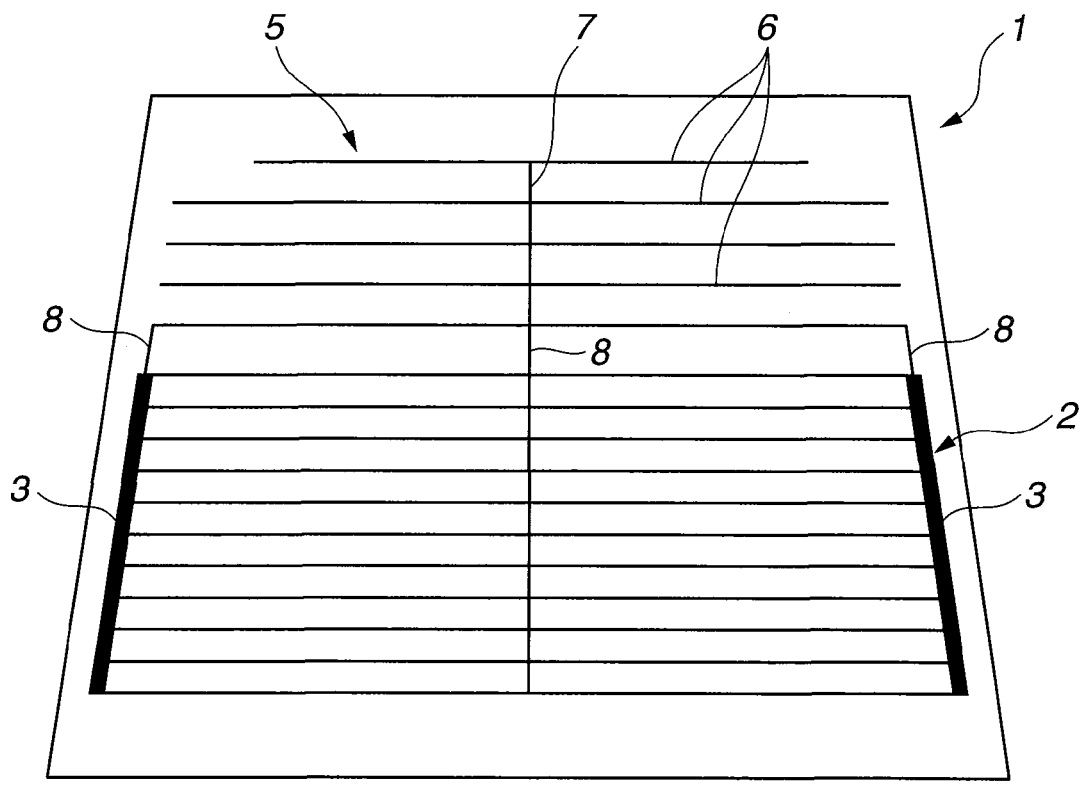
FIG. 2 is a front view of a rear window glass, showing a second embodiment of the present invention

With respect to the noise shield pattern according to the present invention, as shown in FIGS. 1 and 2, it is provided at the head space of the defogger. More specifically, at least three horizontal lines and at least one vertical or perpendicular line are arranged such that these horizontal and vertical lines cross each other, then whole shape of the lines is substantially symmetrical, namely that the noise shield pattern is substantially symmetrical. Further, at least three connecting lines connect the noise shield pattern and an uppermost line of the horizontal heating line of the defogger at symmetrical positions.

Figure 5:
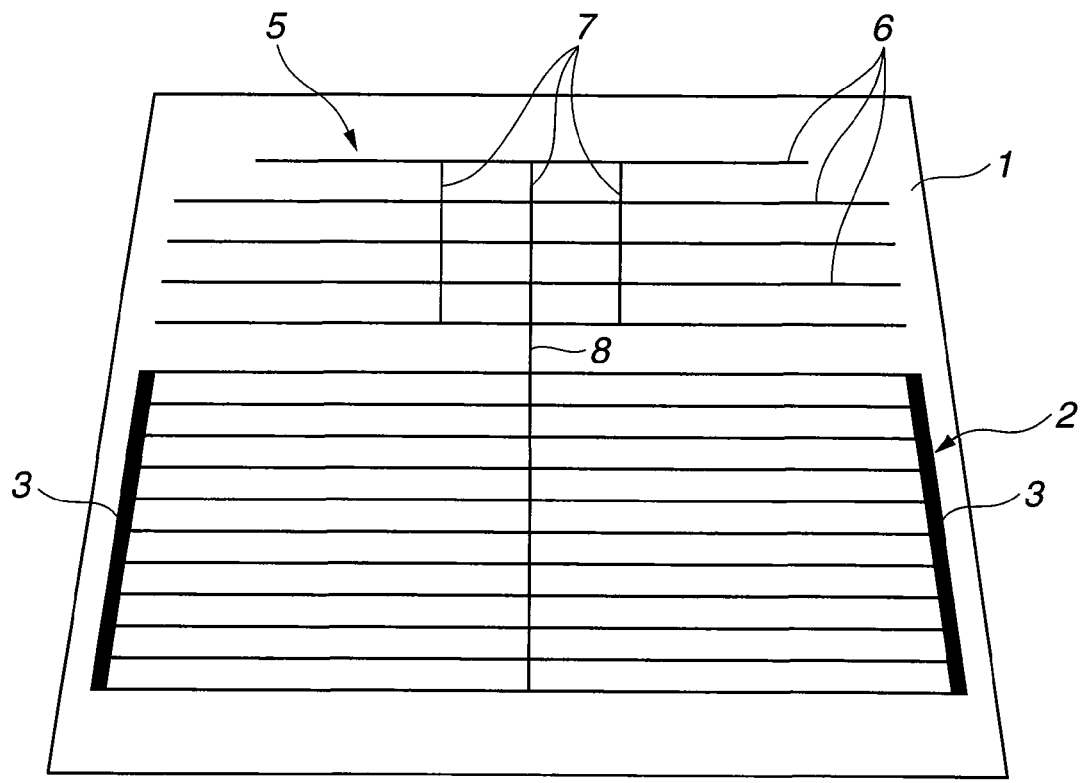
FIG. 5 is a front view of a rear window glass, showing a comparative example 3.

Regarding the connection between the noise shield pattern and the defogger, as shown in FIG. 5, in a case where the noise shield pattern and the defogger are connected by only central one connecting line 8, an impedance from the noise shield pattern to a vehicle body earth (or vehicle body ground) through a negative electrode that is one of two positive and negative electrodes of the busbars 3 of the defogger, becomes high, and therefore an effect of the noise shield cannot be obtained sufficiently.

Accordingly, in order to lower the impedance and enhance the noise shield effect, as shown in FIG. 1, it is desirable that the noise shield pattern and an upper end of the busbars of the defogger be connected in the shortest distance.

Further, in the present invention, the noise shield pattern and also the connection between the noise shield pattern and the defogger are respectively arranged to be symmetrical about a center (or middle) line in the longitudinal direction (i.e. vertical direction) of the window. With these arrangements, during power supply to the defogger, although the current passes through a part of the noise shield pattern, a current balance of the defogger is maintained. This is why these arrangements are adopted.

Furthermore, in the present invention, the noise shield pattern is formed by at least three horizontal lines. The noise is transmitted to the roof antenna through the head space. Thus, by arranging the horizontal lines zonally or arranging the horizontal lines to band (or belt) shape throughout the head space, the noise passes or escapes from the defogger to the ground. This is why three or more horizontal lines are arranged zonally for the noise shield pattern.

Here, regarding the number of the horizontal lines of the noise shield pattern, many lines could also be possible. But it is desirable that the number be set such that an interval or space between the lines of the noise shield pattern is substantially same as an interval of the horizontal heating lines of the defogger. And with this setting, appearance of the noise shield pattern and the defogger becomes good.

As for the vertical lines of the noise shield pattern, at least one line is provided. In a case of one vertical line, as shown in FIG. 2, it is desirable that the one vertical line be set to center. However, in a case of a plurality of the vertical lines, as shown in FIG. 1, it is desirable that the plurality of the vertical lines be set within each 100 mm from a center toward right and left directions such that the vertical lines are symmetrical about the center line.

Figure 6:
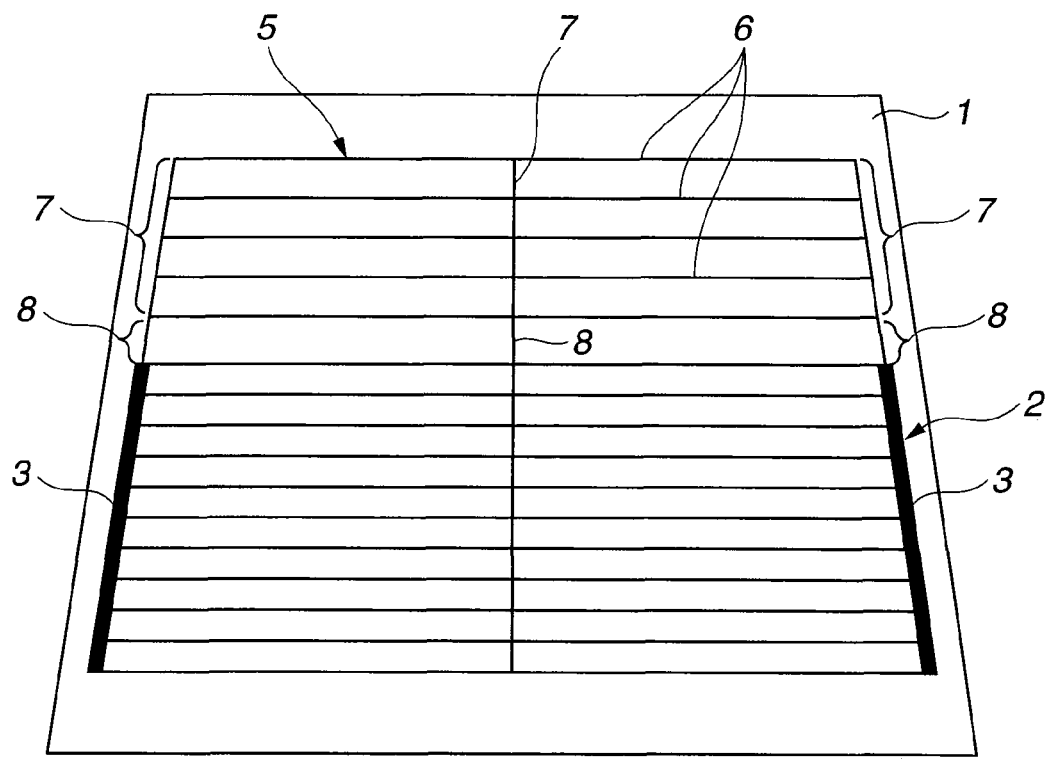
FIG. 6 is a front view of a rear window glass, showing a comparative example 4.

But in contrast to this arrangement of the vertical lines, as shown in FIG. 6, if positions of the vertical lines are separate from the center, the current passing through the part of the horizontal and vertical lines of the noise shield pattern becomes large, and numerous portions of the noise shield pattern heat up. This results in reduction of the current that is supposed to pass through the defogger. Then antifog performance in an antifog heating line area, which is most required of the defogger, namely the antifog performance that removes the fogging of the window and recovers the visibility of the window, is deteriorated. Consequently, to avoid this deterioration, the above arrangement of the vertical lines is preferable.

In addition, an element length of the horizontal line of the noise shield pattern can be adjusted by tuning so that two resonance frequencies of the noise shield pattern and the roof antenna do not overlap with each other. A receive gain of the FM radio wave of the roof antenna is then adjustable.

That is to say, when the lengths of the horizontal lines of the noise shield pattern are set to 300~500 mm from the center position toward right and left directions, the resonance frequency of the noise shield pattern greatly deviates from FM band of 88 MHz~108 MHz. Therefore, the resonance frequencies of the noise shield pattern and the roof antenna do not overlap with each other, and this does not adversely affect the receive sensitivity of the roof antenna. Thus, the above setting of the lengths becomes preferable.

Moreover, as mentioned above, by adjusting the element length of the horizontal line of the noise shield pattern by the tuning, the receive gain of the FM radio wave of the roof antenna can be adjusted. That is, in the case where the lengths of the horizontal lines of the noise shield pattern are set to 300~500 mm from the center position toward right and left directions, this does not adversely affect the receive sensitivity of the roof antenna, and is preferable.

If the lengths of the horizontal lines of the noise shield pattern are set to less than 300 mm, spaces arise at both right and left sides of the noise shield pattern, and the noise is transmitted to the roof antenna through the spaces. In this case, the effect of the noise shield cannot be obtained sufficiently.

Here, as the roof antenna (RMA), it is possible for either of an internal (or domestic) FM radio band of 76 MHz~92 MHz and an external (or overseas) FM radio band of 88 MHz~108 MHz. But, for example in the North America area, the roof antenna (RMA) is the one that is used for receiving the FM radio wave of 88 MHz~108 MHz for the North America area.

The horizontal and vertical lines of the noise shield pattern are formed by printing and burning conductive ceramic paste. More specifically, after a nearly 0.5~1.0 mm wide conductive ceramic paste is printed by screen printing, by burning or baking this printed ceramic paste in a heating furnace, the horizontal and vertical lines of the noise shield pattern are formed. Further, these horizontal and vertical lines are placed and connected to the busbars and heating lines of the defogger by the same printing and burning (baking) manners, and therefore the horizontal and vertical lines have no terminal for external connection.

In the above description, the electrical components indicate devices or systems which produce a high-frequency noise, such as a wiper device, an engine, a power booster, and a variety of driving motors.

The symmetrical noise shield pattern is provided at the head space of the defogger that is disposed on the surface of the rear window glass of the vehicle. Further, the noise shield pattern is connected with the defogger at symmetrical positions by three or more connecting lines. Hence, it can prevent the transmission of the noise produced from electrical components in the vehicle by the respective operations or actions to the rod-shaped roof antenna mounted on the upper rear portion of the roof of the vehicle.

EMBODIMENTS

First Embodiment

Figure 8:
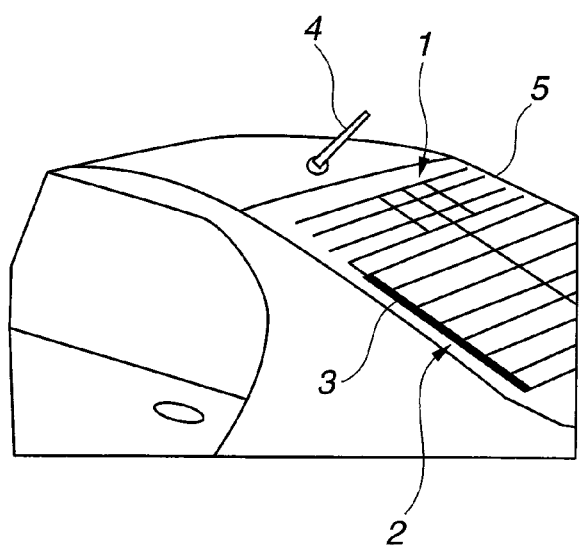
FIG. 8 is a perspective view of a vehicle provided with a noise shield pattern of the present invention and a roof antenna.

A noise shield pattern 5 shown in FIG. 1 is provided at a head space of a defogger 2 that is disposed on a surface of a rear window glass 1 of a vehicle having a roof antenna 4 shown in FIG. 8.

The noise shield pattern 5 is formed such that five horizontal lines 6 and three vertical lines 7 cross each other at the head space of the rear window glass 1. More specifically, a connecting line 8 connects a center of the lowermost horizontal line 6 of the noise shield pattern 5 and a center of the uppermost horizontal heating line of the defogger 2. Further, as shown in FIG. 1, the other two connecting lines 8 connect both right and left ends of the lowermost horizontal line 6 of the noise shield pattern 5 and both busbars 3 of the defogger 2. Here, these connecting lines 8 vertically extend from the busbars 3 up to the both right and left ends of the lowermost horizontal line 6.

The lengths from the center position toward right and left directions, of the five horizontal lines 6 of the top (the first or uppermost) horizontal line to the bottom (the fifth or lowermost) horizontal line, are respectively 400 mm, 530 mm, 535 mm, 540 mm, and 545 mm. On the other hand, the distance between the adjacent horizontal lines 6 (the distances between the first and second horizontal lines, the second and third horizontal lines, . . . the fifth horizontal line and the uppermost horizontal heating line of the defogger 2) are respectively 38 mm, 30 mm, 35 mm, 35 mm, and 30 mm.

As for the three vertical lines 7, the one vertical line 7 is provided at a position of the center line which halves the respective five horizontal lines 6. The other two vertical lines 7 are provided at positions respectively spaced from the center line by 100 mm in the right and left direction, and connect the first to fifth horizontal lines 6.

With respect to the three connecting lines 8 that connect the noise shield pattern 5 and the defogger 2, the center connecting line 8 is the one that is formed by extending the center vertical line 7 to the uppermost horizontal heating line of the defogger 2. The other two connecting lines 8 are the ones that connect the both ends of the fifth horizontal line 6 and the busbars 3, as described above.

The noise shield pattern 5 having such dimensions and the defogger 2 were printed with conductive silver paste, and the noise shield pattern and the defogger which have nearly 0.7 mm line-width were formed. Then the rear window glass 1 formed by burning or baking these noise shield pattern and the defogger, was mounted or installed on the rear window of the vehicle, and the busbars 3 of the both sides were connected to a DC power supply circuit.

Figure 3:
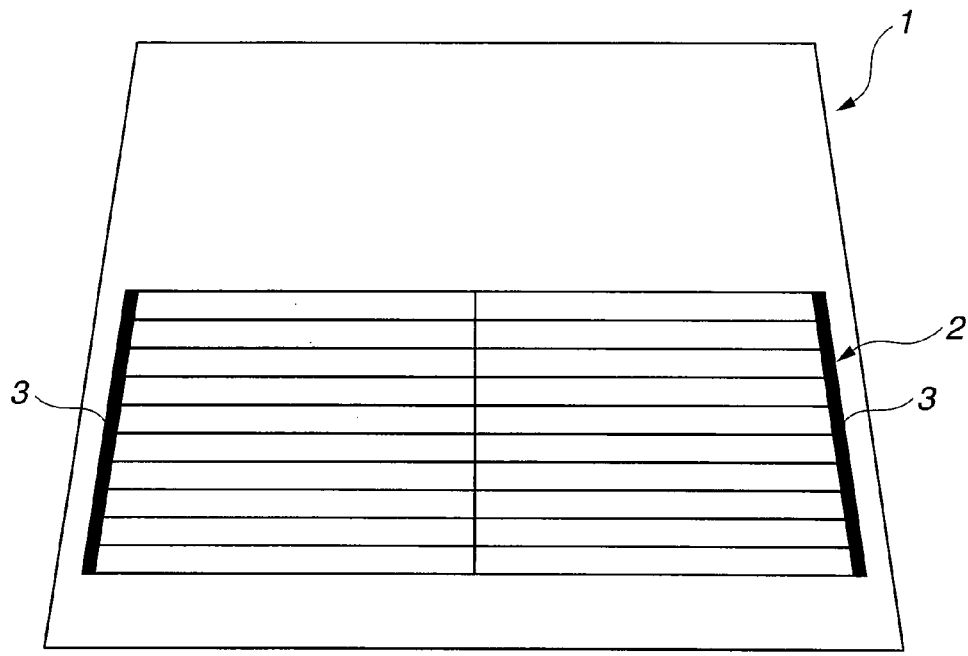
FIG. 3 is a front view of a rear window glass, showing a comparative example 1.

Then, by using the vehicle provided with the rear window glass on which the above noise shield pattern is connected with the defogger, a measurement of horizontal wave (horizontally polarized wave) of FM radio receive band of 88 MHz~108 MHz for the North America area with the roof antenna, was carried out. As a result, an average gain of the frequency band was −6.4 dB. And a considerable improvement of a noise level which the roof antenna received, was seen such that the noise level lowered by 7.9 dB as compared with a case of a comparative example 1 of table 1 where no noise shield pattern is provided at the head space of the defogger 2 as shown in FIG. 3. Further, also a local great dip did not occur throughout the frequency band, and a good frequency characteristic was obtained.

In addition, when the defogger was heated, the antifog performance was at practical level, and there was no problem.

Second Embodiment

A noise shield pattern 5 is shown in FIG. 2. As compared with the first embodiment, the lengths and the distances of five horizontal lines 6 are the same as those of the first embodiment. But regarding the vertical line, the three vertical lines 7 are provided in the first embodiment, whereas one vertical line 7 is provided at the position of the center line which halves the respective five horizontal lines 6 such that the one vertical line 7 and the respective five horizontal lines 6 cross each other in the second embodiment. With respect to the connection between the noise shield pattern 5 and a defogger 2, it is the same as that of the first embodiment, that is, as shown in FIG. 2, three connecting lines 8 connect the noise shield pattern 5 and the defogger 2.

The noise shield pattern 5 having such dimensions and the defogger 2 were printed with conductive silver paste, and the noise shield pattern and the defogger which have nearly 0.7 mm line-width were formed. Then a rear window glass 1 formed by burning or baking these noise shield pattern and the defogger, was mounted on the rear window of the vehicle, and the busbars 3 of the both sides were connected to a DC power supply circuit.

Then, by using the vehicle provided with the rear window glass on which the above noise shield pattern is connected with the defogger, a measurement of horizontal wave (horizontally polarized wave) of FM radio receive band of 88 MHz~108 MHz for the North America area with the roof antenna, was carried out. As a result, an average gain of the frequency band was −6.4 dB. And a considerable improvement of the noise level which the roof antenna received, was seen such that the noise level lowered by 7.4 dB as compared with the case of the comparative example 1 of table 1 where no noise shield pattern is provided at the head space of the defogger 2 as shown in FIG. 3. Further, also a local great dip did not occur throughout the frequency band, and a good frequency characteristic was obtained.

In addition, when the defogger was heated, the antifog performance was at practical level, and there was no problem.

Comparative Example 1

FIG. 3 shows the comparative example 1 in which no noise shield pattern is provided at the head space of the defogger of the rear window glass. By using the vehicle provided with the rear window glass on which the noise shield pattern is not provided, a measurement of horizontal wave (horizontally polarized wave) of FM radio receive band of 88 MHz~108 MHz for the North America area with the roof antenna, was carried out. As a result, a local great dip did not occur throughout the frequency band, and an average gain of the frequency band was −6.7 dB. In addition, when the defogger was heated, the antifog performance was at practical level. However, a noise level which the roof antenna received was high, and the receiving performance was not at practical level owing to the noise failure.

Comparative Example 2

Figure 4:
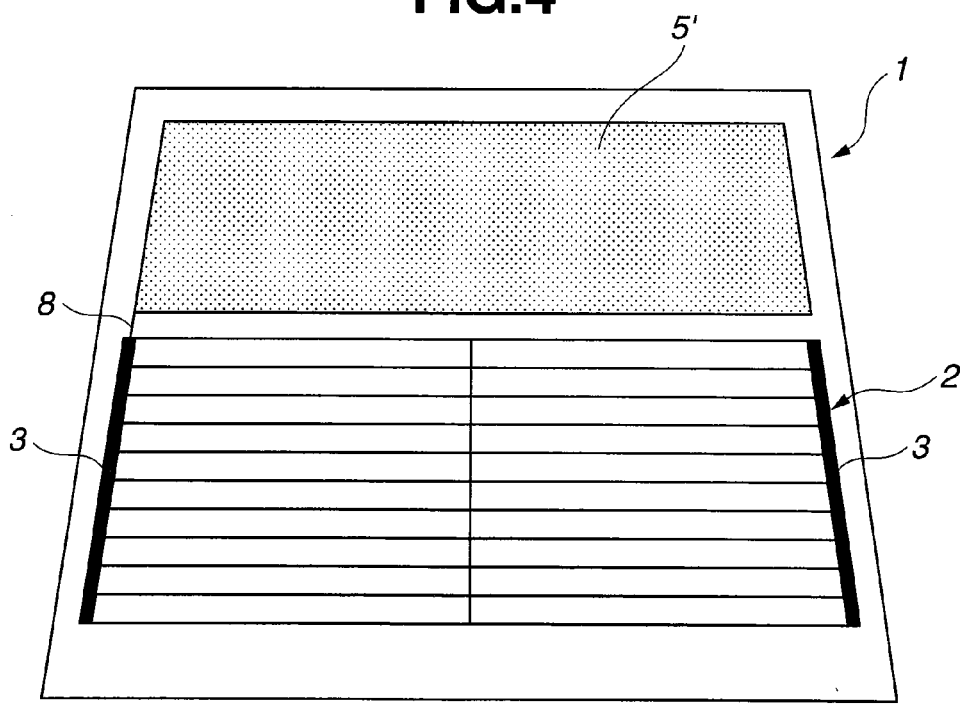
FIG. 4 is a front view of a rear window glass, showing a comparative example 2.

FIG. 4 shows a comparative example 2 in which a 40-micron-thick copper foil or leaf 5' is provided at whole area of a head space of a defogger 2 of the rear window glass for noise shield use and a connecting line 8 connects a lower corner portion of the copper foil 5' and one busbar 3 of the defogger 2.

By using the vehicle provided with the rear window glass on which the copper foil 5' is provided at the head space of the defogger 2, a measurement of horizontal wave (horizontally polarized wave) of FM radio receive band of 88 MHz~108 MHz for the North America area with the roof antenna, was carried out. As a result, an average gain of the frequency band was −8.0 dB without affecting the antifog performance during the heating of the defogger. A noise level which the roof antenna received, lowered greatly such that the noise level lowered by 8.6 dB as compared with the case of the comparative example 1 of table 1 where no noise shield pattern is provided at the head space of the defogger 2 as shown in FIG. 3. Further, the noise failure also did not occur. However, a local great dip occurred throughout the frequency band. In addition, there were a problem that the sufficient visibility of the rear window from driver's seat side is not secured owing to an area of the copper foil 5'.

Furthermore, during vehicle travel, extraneous radio waves by the copper foil and reflected waves of electromagnetic waves which the electrical components produce, are produced. Because of this, the measurement found that these adversely affect an antenna gain of the roof antenna (RMA).

Comparative Example 3

FIG. 5 shows a comparative example 3 in which the noise shield pattern 5 and the defogger 2 of the first embodiment are connected with each other by only one connecting line 8 that is provided on the center line in right and left directions of the noise shield pattern 5.

By using the vehicle provided with the rear window glass on which the above noise shield pattern is connected with the defogger, a measurement of horizontal wave (horizontally polarized wave) of FM radio receive band of 88 MHz~108 MHz for the North America area with the roof antenna, was carried out. As a result, an average gain of the frequency band was −6.5 dB. Further, also a local great dip did not occur throughout the frequency band, and a good frequency characteristic was obtained. Moreover, when the defogger was heated, the antifog performance was an acceptable level. However, a noise level which the roof antenna received was high. Although the noise level was 5.1 dB and was improved a little as compared with the case of the comparative example 1 of table 1 where no noise shield pattern is provided at the head space of the defogger 2 as shown in FIG. 3, the measurement found that the receiving performance is not at practical level.

Comparative Example 4

FIG. 6 shows a comparative example 4. The comparative example 4 is the same as the first embodiment, except that the arrangement positions of three vertical lines 7 of a noise shield pattern 5 are different from the first embodiment, and further, five horizontal lines 6 of the noise shield pattern 5 have the same length in the comparative example 4. With regard to the connection between the noise shield pattern 5 and the defogger 2, it is the same between the comparative example 4 and the first embodiment.

The one center vertical line 7 of the three vertical lines 7 is arranged at the same position as the first embodiment. The other two vertical lines 7 are linearly provided at both ends of the respective horizontal lines 6.

By using the vehicle provided with the rear window glass on which the above noise shield pattern is connected with the defogger, a measurement of horizontal wave (horizontally polarized wave) of FM radio receive band of 88 MHz~108 MHz for the North America area with the roof antenna, was carried out. As a result, an average gain of the frequency band was −6.3 dB. Further, an improvement of the noise level which the roof antenna received, was seen such that the noise level lowered by 8.0 dB as compared with the case of the comparative example 1 of table 1 where no noise shield pattern is provided at the head space of the defogger 2 as shown in FIG. 3. In addition, a local great dip did not occur throughout the frequency band, and a good frequency characteristic was obtained.

However, upon applying the current to the defogger for heating, the current passes throughout the lengths of all horizontal lines 6 of the noise shield pattern 5. Because of this, the current which is supposed to pass through the heating lines of the defogger area, passes also through the noise shield pattern side, and this results in reduction of the current for the defogger. The measurement then found that the antifog performance of the defogger is not an acceptable level and is not at practical level.

Comparative Example 5

Figure 7:
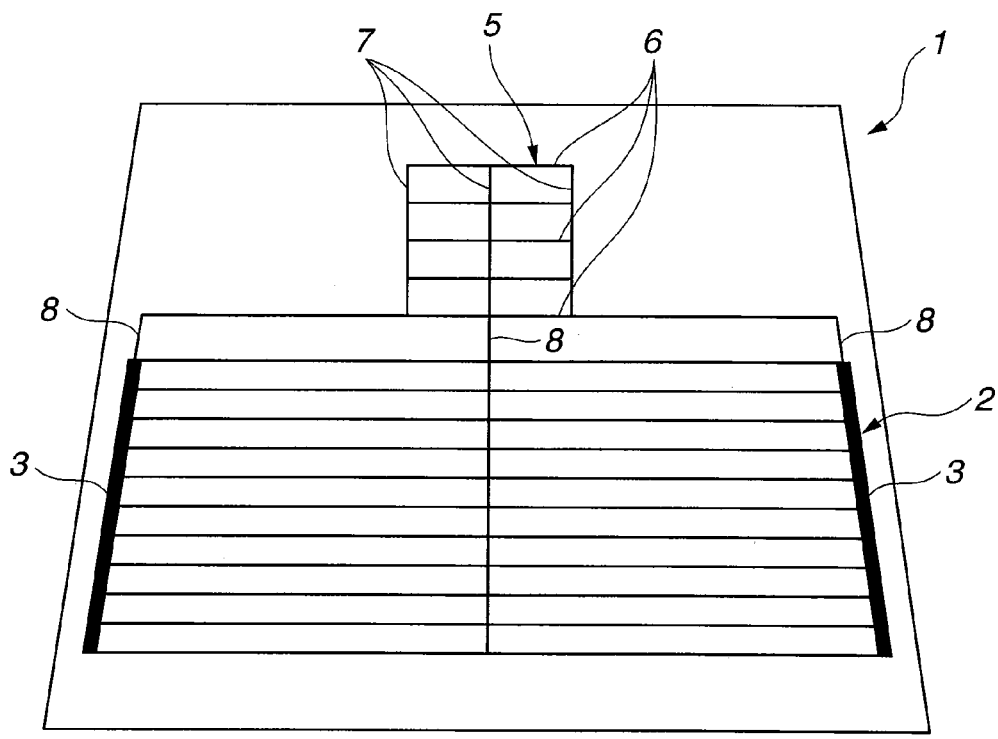
FIG. 7 is a front view of a rear window glass, showing a comparative example 5.

FIG. 7 shows a comparative example 5. The comparative example 5 is the same as the first embodiment, except that the lengths of the upper four horizontal lines 6 of the noise shield pattern 5 are respectively set to 100 mm from a center in both right and left directions. Further, the connection between the noise shield pattern 5 and the defogger 2 of the comparative example 5 is the same as that of the first embodiment.

The rear window glass on which the above noise shield pattern is connected with the defogger, is installed in the rear window of the vehicle. Then, when applying the current to the defogger 2 for heating, the current separately passes also through the noise shield pattern 5. But since an area which is formed by or enclosed with the lines of the noise shield pattern 5 through which the current passes, is relatively small, the current that passes through the heating lines of the defogger area is sufficient, and the antifog performance of the defogger was an acceptable level.

When a measurement of horizontal wave (horizontally polarized wave) of FM radio receive band of 88 MHz~108 MHz for the North America area with the roof antenna, was carried out, an average gain of the frequency band was −7.3 dB. However, although the noise level which the roof antenna received was 3.5 dB and was improved a little as compared with the case of the comparative example 1 of table 1 where no noise shield pattern is provided at the head space of the defogger 2 as shown in FIG. 3, the noise level was still high. In addition, an occurrence of a local great dip arose throughout the frequency band, and a noise failure and a frequency characteristic of the roof antenna were not acceptable levels.

In the following table 1, the above results, the noise level, the frequency characteristic of the roof antenna, and the antifog performance of the defogger of two embodiments and the five comparative examples, are shown.

TABLE 1

|  | Noise reduction amount with respect to Comparative example 1 (dB) | Frequency characteristic of RMA Average gain (dB) | Frequency characteristic of RMA Dip | Antifog performance of the defogger |
| --- | --- | --- | --- | --- |
| 1st Embodiment | 7.9 | −6.4 | NO | ○ |
| 2nd Embodiment | 7.4 | −6.4 | NO | ○ |
| Comparative example 1 | 0 | −6.7 | NO | ○ |
| Comparative example 2 | 8.6 | −8.0 | YES | ○ |
| Comparative example 3 | 5.1 | −6.5 | NO | ○ |
| Comparative example 4 | 8.0 | −6.3 | NO | X |
| Comparative example 5 | 3.5 | −7.3 | YES | ○ |

In the present invention, in the vehicle having the roof antenna mounted on the upper rear portion of the roof, the noise shield pattern is provided at the head space of the defogger (the heating lines for defogging) that is disposed on the surface of the rear window of the vehicle. And the noise shield pattern does not adversely affect the roof antenna. Consequently, it is useful for receiving the FM radio wave without the noise.

This application is based on a prior Japanese Patent Application No. 2006-306533 filed on Nov. 13, 2006. The entire contents of this Japanese Patent Application No. 2006-306533 are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A window glass of a vehicle having a roof antenna mounted on an upper rear portion of a roof of the vehicle, comprising:
   a defogger formed by a plurality of horizontal heating lines on a rear window glass, the horizontal heating lines being connected with each other at the respective both ends by busbars;
   a noise shield pattern provided at a head space of the defogger on the rear window glass for preventing noise caused by electrical components in the vehicle from being transmitted to the roof antenna, the noise shield pattern having at least three horizontal lines and at least one vertical line that cross each other, and forming a symmetrical pattern; and
   at least three connecting lines contacting the noise shield pattern and the defogger at each of
   a) a center position in the right-and-left directions of the noise shield pattern and the defogger and
   b) symmetrical positions about the center position in the right-and-left directions of the noise shield pattern and the defogger.

2. The window glass of the vehicle, as claimed in claim 1, wherein:
   lengths of the at least three horizontal lines of the noise shield pattern are set to 300~500 mm from the center position toward the right and left directions.

3. The window glass of the vehicle, as claimed in claim 1, wherein:
   the number of the at least one vertical line of the noise shield pattern comprises three vertical lines.

4. The window glass of the vehicle, as claimed in claim 3, wherein:
   a distance in the right and left directions of the vertical lines is set to 100 mm or less.

5. The window glass of the vehicle, as claimed in claim 1, wherein:
   the symmetrical positions where the noise shield pattern and the defogger are contacted by the at least three connecting lines are located at respective both ends of the noise shield pattern and the defogger.

6. The window glass of the vehicle, as claimed in claim 1, wherein:
   the at least three connecting lines contact the defogger and only a lowermost horizontal line of the noise shield pattern.

* * * * *